United States Patent
Liu et al.

(10) Patent No.: US 12,094,962 B2
(45) Date of Patent: Sep. 17, 2024

(54) ENHANCEMENT-MODE SEMICONDUCTOR DEVICE AND PREPARATION METHOD THEREFOR

(71) Applicant: SUN YAT-SEN UNIVERSITY, Guangdong (CN)

(72) Inventors: Yang Liu, Guangdong (CN); Liang He, Guangdong (CN)

(73) Assignee: SUN YAT-SEN UNIVERSITY, Guangdong (CN)

( * ) Notice: Subject to any disclaimer, the term of this patent is extended or adjusted under 35 U.S.C. 154(b) by 540 days.

(21) Appl. No.: 17/356,541

(22) Filed: Jun. 24, 2021

(65) Prior Publication Data
US 2021/0320199 A1 Oct. 14, 2021

Related U.S. Application Data

(63) Continuation of application No. PCT/CN2019/072317, filed on Jan. 18, 2019.

(30) Foreign Application Priority Data

Jan. 15, 2019 (CN) .......................... 201910037334.9

(51) Int. Cl.
*H01L 29/778* (2006.01)
*H01L 29/40* (2006.01)
(Continued)

(52) U.S. Cl.
CPC ........ *H01L 29/7786* (2013.01); *H01L 29/401* (2013.01); *H01L 29/42316* (2013.01); *H01L 29/66462* (2013.01)

(58) Field of Classification Search
CPC ............... H01L 29/7786; H01L 29/401; H01L 29/42316; H01L 29/66462
See application file for complete search history.

(56) References Cited

U.S. PATENT DOCUMENTS 9,245,991 B2 * 1/2016 Liu .................. H01L 21/02378
10,790,787 B2 * 9/2020 Mahon .............. H01L 29/42316
(Continued)

FOREIGN PATENT DOCUMENTS

| CN | 103337516 | 10/2013 |
| CN | 106033724 | 10/2016 |

(Continued)

OTHER PUBLICATIONS

Kevin J. Chen et al., "GaN-on-Si Power Technology: Devices and Applications," IEEE Transactions on Electron Devices, vol. 64, Mar. 2017, pp. 779-795.

(Continued)

*Primary Examiner* — Mark W Tornow
(74) *Attorney, Agent, or Firm* — JCIPRNET

(57) ABSTRACT

The present invention relates to an enhancement-mode semiconductor device and a preparation method therefor. The device includes a substrate, a semiconductor epitaxial layer, a gate electrode, a source electrode, and a drain electrode. The epitaxial layer includes a nitride nucleation layer, a nitride stress buffer layer, a nitride channel layer, a primary epitaxial nitride barrier layer, a p-type nitride layer and a secondary epitaxial nitride barrier layer. By means of etching, the p-type nitride in a gate electrode region is reserved, realizing the depletion of a gate electrode channel. By means of maskless regrowth, the secondary epitaxial nitride barrier layer is grown on the primary epitaxial barrier layer and the p-type nitride layer in the gate electrode region, realizing a high-conduction access region.

11 Claims, 19 Drawing Sheets

(51) Int. Cl.
*H01L 29/423* (2006.01)
*H01L 29/66* (2006.01)

(56) References Cited

U.S. PATENT DOCUMENTS

| | | | | |
|---|---|---|---|---|
| 10,855,230 | B2* | 12/2020 | Mahon | H01L 29/788 |
| 11,335,797 | B2* | 5/2022 | Chen | H01L 29/66462 |
| 2018/0248027 | A1 | 8/2018 | Okita et al. | |
| 2018/0308953 | A1* | 10/2018 | Chiu | H01L 21/02164 |

FOREIGN PATENT DOCUMENTS

| | | |
|---|---|---|
| CN | 106486363 | 3/2017 |
| JP | 2005243727 | 9/2005 |

OTHER PUBLICATIONS

Hideyuki Okita et al., "Through Recess and Regrowth Gate Technology for Realizing Process Stability of GaN-Based Gate Injection Transistors," IEEE Transactions on Electron Devices, vol. 64, Mar. 2017, pp. 1-6.

Giuseppe Greco et al., "Review of technology for normally-off HEMTs with p-GaN gate," Materials Science in Semiconductor Processing, Sep. 2017, pp. 1-11.

* cited by examiner

ENHANCEMENT-MODE SEMICONDUCTOR DEVICE AND PREPARATION METHOD THEREFOR

CROSS-REFERENCE TO RELATED APPLICATION

This application is a continuation of international application of PCT application serial no. PCT/CN2019/072317 filed on Jan. 18, 2019, which claims the priority benefit of China application no. 201910037334.9 filed on Jan. 15, 2019. The entirety of each of the above mentioned patent applications is hereby incorporated by reference herein and made a part of this specification.

BACKGROUND

Technical Field

The present invention relates to the technical field of semiconductor devices, and more particularly relates to an enhancement-mode semiconductor device and a preparation method therefor.

Description of Related Art

A third-generation semiconductor material represented by a GaN material has a great development space in high-temperature, high-frequency, radiation-resistance, and high-power application fields due to the advantages of wide band gap, high saturated drift velocity, high breakdown electric field and the like.

A GaN-based electronic device usually uses high-concentration and high-mobility two-dimensional electron gas (2DEG) at an AlGaN/GaN heterostructure interface to work, so that the device has the advantages of low on-resistance, large output current, and high switching speed. However, just because of this AlGaN/GaN heterostructure, under the condition of zero external gate bias, the device is naturally in an on state, i.e., a depletion-mode operation.

The realization of a high-performance GaN-based enhancement-mode electronic device is an important challenge, and it requires a more positive threshold voltage to simplify a peripheral circuit of the device and ensure system-level failure safety, thus ensuring the reliable operation of power electronic system. A general idea of realizing a normally-off device is to reserve high-conduction 2DEG in AlGaN/GaN access region, that is to say, the conduction capacity in gate-source access region and gate-drain access region of the device is not influenced and at the same time, 2DEG under gate channel is depleted, so that the gate electrode of the device can be switched off under the condition of zero bias. At present, the industry generally adopts three methods to realize a normally-off GaN-based device (IEEE TRANSACTIONS ON ELECTRON DEVICES, VOL. 64, NO. 3, MARCH 2017, Page 779-795): (1) an insulated trench gate structure (MOSFET), (2) a Cascode structure, and (3) a p-type gate structure (p-GaN gate structure, as shown in FIG. 1).

In the above structures, due to the advantages of simple structure, good threshold voltage stability and the like, a p-type gate device has attracted the attention of the academic and industrial circles. At present, the p-type gate device has begun to be industrialized. The main companies launching this structure include Panasonic Corporation from Japan, EPC Corporation from United State and GaN Systems Inc. from Canada. In particular, the Panasonic Corporation has prepared p-type gate devices with better threshold voltage characteristics (IEEE TRANSACTIONS ON ELECTRON DEVICES, VOL. 64, NO. 3, MARCH 2017, Page 1026-1031) by adopting the technical solutions of combining groove etching, regrowth and p-type layer etching.

For the realization of p-type gate normally-off AlGaN/GaN HEMT devices, the industry mainly adopts etching-based technical solutions. This technology has become a commonly used method in the industry due to its advantage of easy realization. However, this method has many shortcomings, for example, when a p-GaN material in an access region is removed through etching, since the etching uniformity is poor, the over-etching problem exists, and lattice damage will be brought to the surface of the AlGaN barrier layer by the etching, additional defect energy levels will be introduced, and the degradation of electric characteristics of 2DEG in the access region will be caused, so that the performance uniformity and stability of the device can be deteriorated.

Another technical solution of selective-area p-GaN growth technology is also adopted (as shown in FIG. 2), that is, the selective-area growth of the p-GaN layer on the AlGaN/GaN heterostructure is performed, so as to achieve the formation of the p-GaN layer in the gate electrode region while no p-GaN layer structure exists in the access region (Materials Science in Semiconductor Processing, Vol. 78, 2018, Pages 96-106). However, due to the influence of epitaxial growth kinetics, when the gate length of the device is small, i.e., a growth window is very narrow, growth rate of selective-area growth of the p-GaN material is difficult to control, and the defects of doping nonuniformity and the like exist. There is no breakthrough in these aspects at present. Additionally, selective-area growth requires additional formation of a patterned mask layer on the surface of GaN wafer. The most commonly used is a $SiO_2$ mask layer. $SiO_2$ is easily decomposed to produce elements Si and O at high temperatures, and elements Si and O easily form donor-type doping when diffusing into an epitaxial layer, so that leakage current is caused, and the quality of epitaxial crystals is seriously deteriorated. Moreover, the influence of the mask layer on the epitaxial growth kinetics cannot be ignored.

In addition, the hole concentration of the p-GaN layer is generally not high, and a current mainstream reported value is basically lower than $1 \times 10^{18}$ cm$^{-3}$. Therefore, the Al content in the AlGaN barrier layer under the p-GaN layer is generally required to be less than 20%, and the thickness is required to be less than 18 nm, this is conducive to the realization of enhancement-mode operation, but at the same time, it will cause resistance increase of the access region. The relatively thin AlGaN barrier layer will also make doping elements (such as magnesium) in the p-GaN layer more easily diffuse to AlGaN/GaN channel to further influence the reliability of the device.

SUMMARY

In order to overcome at least one of the above defects in the prior art, the present invention provides an enhancement-mode semiconductor device capable of realizing higher threshold voltage, lower on-resistance, lower leakage current and more stable work state.

In order to solve the technical problems, the present invention adopts the following technical solution: an enhancement-mode semiconductor device, including a substrate, a semiconductor epitaxial layer growing on the substrate, a gate electrode, a source electrode, and a drain electrode. The epitaxial layer includes a nitride nucleation layer, a nitride stress buffer layer, a nitride channel layer, a primary epitaxial nitride barrier layer, a p-type nitride layer and a secondary epitaxial nitride barrier layer from bottom to top; the p-type nitride layer is only reserved on the primary epitaxial nitride barrier layer in a gate electrode region, realizing the depletion of two-dimensional electron gas channel under the gate electrode; a secondary epitaxy is maskless, and the secondary epitaxial nitride barrier layer is grown on the primary epitaxial barrier layer and the p-type nitride layer in the gate electrode region; and gate electrode metal is in direct contact with the secondary epitaxial nitride barrier layer.

The p-type nitride layer beyond the gate electrode region is etched to reserve the p-type nitride in the gate electrode region, realizing the depletion state of gate channel. Mask influence in a secondary growth process is avoided, and the secondary epitaxial nitride barrier layer is grown on the primary epitaxial barrier layer and the p-type nitride layer in the gate electrode region, realizing a high-conduction access region. At the same time, by adjusting the thickness and Al component of the primary epitaxial nitride barrier layer and the secondary epitaxial nitride barrier layer, the more superior turn-off capability of gate electrode and high-conduction gate-source access region and gate-drain access region are realized. Additionally, the method can effectively repair access region damage caused by etching, and the requirements for the etching process are also reduced. Finally, the enhancement-mode semiconductor device is realized with high threshold voltage, high conductivity and high stability.

Further, the substrate is any one of a Si substrate, a sapphire substrate, a silicon carbide substrate, a GaN self-supporting substrate or AlN.

Further, the nitride stress buffer layer contains any one of AlN, AlGaN, GaN and SiN or a combination of AlN, AlGaN, GaN and SiN; and the nitride nucleation layer is an Al-containing nitride layer.

Further, the nitride channel layer is a GaN or AlGaN layer.

Further, the primary epitaxial nitride barrier layer is a material of one of AlGaN, AlInN, InGaN, AlInGaN, and AlN, or a material of a combination of any of AlGaN, AlInN, InGaN, AlInGaN, and AlN, an Al component content in the primary epitaxial nitride barrier layer is 1% to 30%, and a thickness of the primary epitaxial nitride barrier layer is 1 nm to 30 nm.

Further, the secondary epitaxial nitride barrier layer is one of AlGaN, AlInN, InGaN, AlInGaN and AlN or a combination of any of AlGaN, AlInN, InGaN, AlInGaN and AlN, an Al component content in the secondary epitaxial nitride barrier layer is 1% to 40%, and a thickness of the secondary epitaxial nitride barrier layer is 1 nm to 40 nm.

Further, the p-type nitride layer is GaN, AlGaN, AlInN or AlInGaN, and a thickness of the p-type nitride layer is not less than 5 nm.

Further, an AlN space layer is further inserted between the primary epitaxial nitride barrier layer and the nitride channel layer, and a thickness of the AlN space layer is 0.3 nm to 3 nm.

Further, an AlN barrier layer is further inserted between the p-type nitride layer and the primary epitaxial nitride barrier layer, and a thickness of the AlN barrier layer is 0.3 nm to 5 nm.

Further, the Al component content in the secondary epitaxial nitride barrier layer is generally higher than that in the primary epitaxial nitride barrier layer.

Further, the p-type nitride layer in the gate electrode region is reserved, and the primary epitaxial nitride barrier layer beyond a region under the p-type nitride layer in the gate electrode region is partially removed, and a thickness of the rest primary epitaxial nitride barrier layer is 1 nm to 30 nm.

Further, a cap layer and a passivation layer are in-situ grown on the secondary epitaxial nitride barrier layer; the cap layer is GaN, and a thickness of the cap layer is 0.5 nm to 8 nm; and the passivation layer is SiN, and a thickness of the passivation layer is 1 nm to 100 nm.

Further, the source electrode and the drain electrode are in ohmic contact, and the gate electrode is in ohmic contact or Schottky contact.

The present invention further provides a preparation method for an enhancement-mode semiconductor device, including the following steps:

S1. growing a nitride nucleation layer on a substrate;

S2. growing a nitride stress buffer layer on the nitride nucleation layer;

S3. growing a nitride channel layer on the nitride stress buffer layer;

S4. growing a primary epitaxial nitride barrier layer on the nitride channel layer;

S5. growing a p-type nitride layer on the primary epitaxial nitride barrier layer;

S6. forming a p-type nitride layer which is only reserved on the primary epitaxial nitride barrier layer in a gate electrode region, by photolithography patterning and etching methods;

S7. growing a secondary epitaxial nitride barrier layer; wherein the secondary epitaxial nitride barrier layer located on the primary epitaxial barrier layer and the p-type nitride layer in the gate electrode region, and a growth process of the secondary epitaxial nitride barrier layer is maskless;

S8. activating acceptor doping elements in the p-type nitride layer through high-temperature annealing;

S9. performing dry etching to complete device isolation, and simultaneously etching out ohmic contact regions of source electrode and drain electrode;

S10. forming source electrode and drain electrode ohmic contact metal on source electrode and drain electrode regions;

S11. forming gate electrode metal on the p-type nitride layer in a gate electrode region and on the secondary epitaxial nitride barrier layer; wherein gate electrode metal is in direct contact with the secondary epitaxial nitride barrier layer.

In the background, it is mentioned that when a traditional etching solution is used to prepare a p-type gate enhancement-mode device, the requirements for equipments and processes are very harsh. Some problems caused by over-etching and etching damage will seriously degrade device characteristics. The present invention proposes to combine etching method with regrowth technology: firstly, a partial primary epitaxial nitride barrier layer and a p-type nitride layer beyond a gate electrode region are removed through dry etching, and the primary epitaxial nitride barrier layer and the p-type nitride layer in the gate electrode region are reserved, so as to realize the depletion of the gate electrode channel. Then, regrowth process is performed. The lattice damage of the primary epitaxial barrier layer induced by etching is repaired through high temperature treatment in MOCVD chamber (the repair may be in nitrogen gas, ammonia gas environment or environment of mixed gas of nitrogen gas and ammonia gas). The regrowth process is maskless, and the secondary epitaxial barrier layer is grown on whole wafer surface, and the influence of SiO$_2$ mask on the regrowth can be eliminated. The secondary epitaxial nitride barrier layer grown in accessed region will help to realize high-conduction AlGaN/GaN heterostructure channel. The secondary epitaxial barrier layer grown at the side surface and the upper surface of the p-type nitride layer in the gate region will form AlGaN/GaN heterostructures. It has few influence on gate switch-off state. Switch-off can be completely ensured in the two surfaces due to non-polar surface or half-polar surface formation and hole depletion effects. Additionally, the obvious improvement of the switch characteristics can be achieved through the redesign of the primary epitaxial barrier layer and the secondary epitaxial barrier layer of the device, including the design on aluminum components in the barrier layers and the thickness of the barrier layers.

Compared with the prior art, the present invention has the beneficial effects as follows:

The present invention provides the enhancement-mode semiconductor device and the preparation method therefor. The regrowth technology is adopted in the present invention, so that feasibility is also provided for the design of nitride barrier layers in the gate region and access region beyond the gate electrode. By designing structures of the primary epitaxial nitride barrier layer and the secondary epitaxial nitride barrier layer, switch-off characteristics of the heterojunction channel under gate electrode and conductivity of heterojunction channel of the access region are reasonably realized at the same time. This advantage cannot be achieved by the conventional etching solution or selective-area epitaxial p-GaN solution. Finally, the technology of the present invention can effectively realize the enhancement-mode device having high threshold voltage, high conductivity, low leakage and high stability.

BRIEF DESCRIPTION OF THE DRAWINGS

FIG. 3 to FIG. 12 are schematic process diagrams of a manufacturing method of the device of Embodiment 1 of the present invention.

Figure 1:
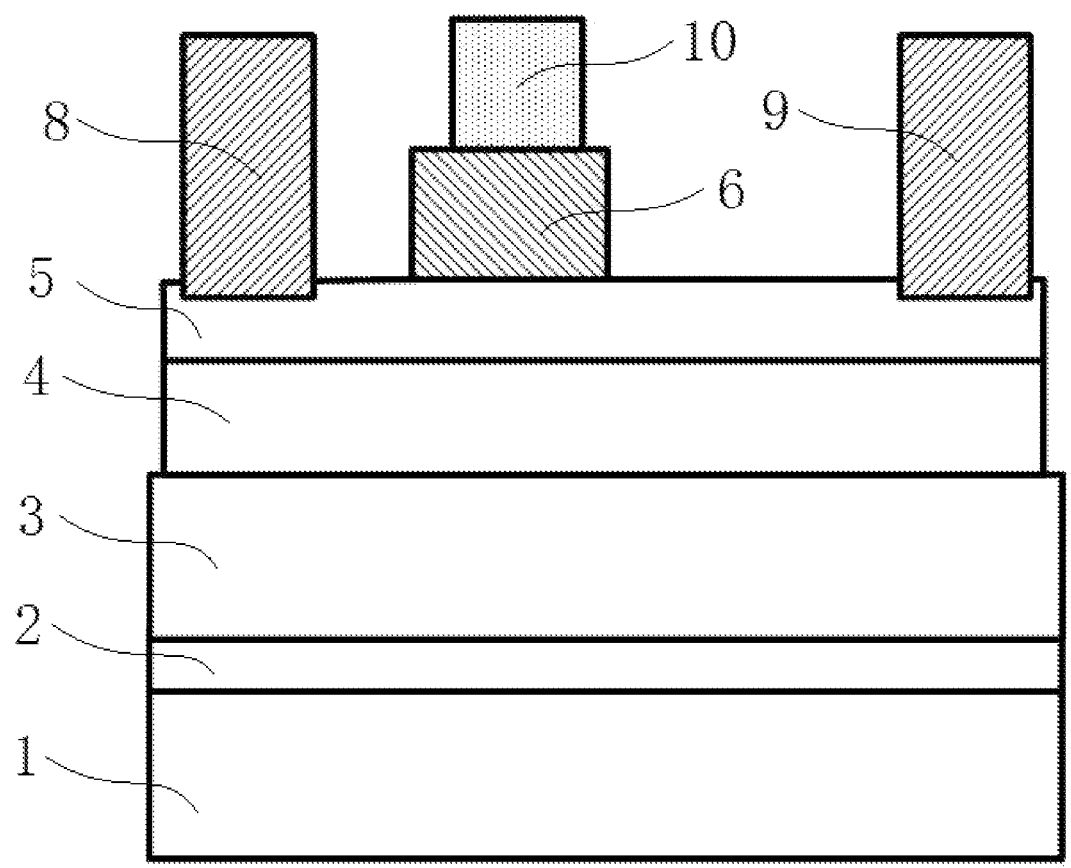
FIG. 1 is a schematic structure diagram of an enhancement-mode device based on conventional etching solution.
Figure 2:
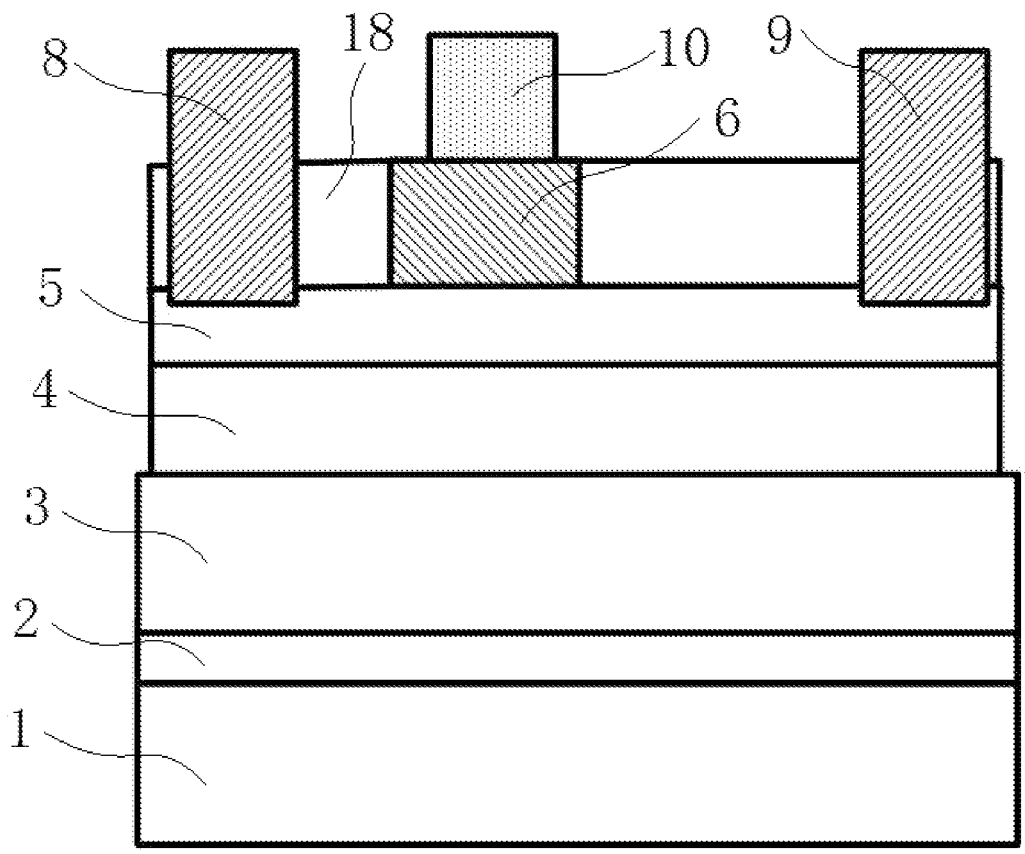
FIG. 2 is a schematic structure diagram of an enhancement-mode device based on selective-area epitaxial p-GaN solution.

In the figures, 1 denotes a substrate; 2 denotes a nitride nucleation layer; 3 denotes a nitride stress buffer layer; 4 denotes a nitride channel layer; 5 denotes a primary epitaxial nitride barrier layer; 6 denotes a p-type nitride layer; 7 denotes a secondary epitaxial nitride barrier layer; 8 denotes a source electrode; 9 denotes a drain electrode; 10 denotes a gate electrode; 11 denotes an MN space layer; 12 denotes a secondary epitaxial nitride channel layer; 13 denotes a cap layer or an in-situ passivation layer; 14 denotes a passivation layer; 15 denotes a source electrode field plate; 16 denotes a bridging dielectric layer; 17 denotes a thick drain electrode; and 18 denotes a SiO$_2$ mask layer.

DESCRIPTION OF THE EMBODIMENTS

The drawings are only for exemplary description, and should not be understood as a limitation of the present invention. In order to better illustrate the embodiments, some parts of the drawings may be omitted, enlarged or reduced, so the sizes do not represent the sizes of actual products; for those skilled in the art, it is understandable that some well-known structures in the drawings and their descriptions may be omitted. The positional relationship described in the drawings is only for exemplary description, and should not be understood as a limitation of the present invention.

Embodiment 1

Figure 12:
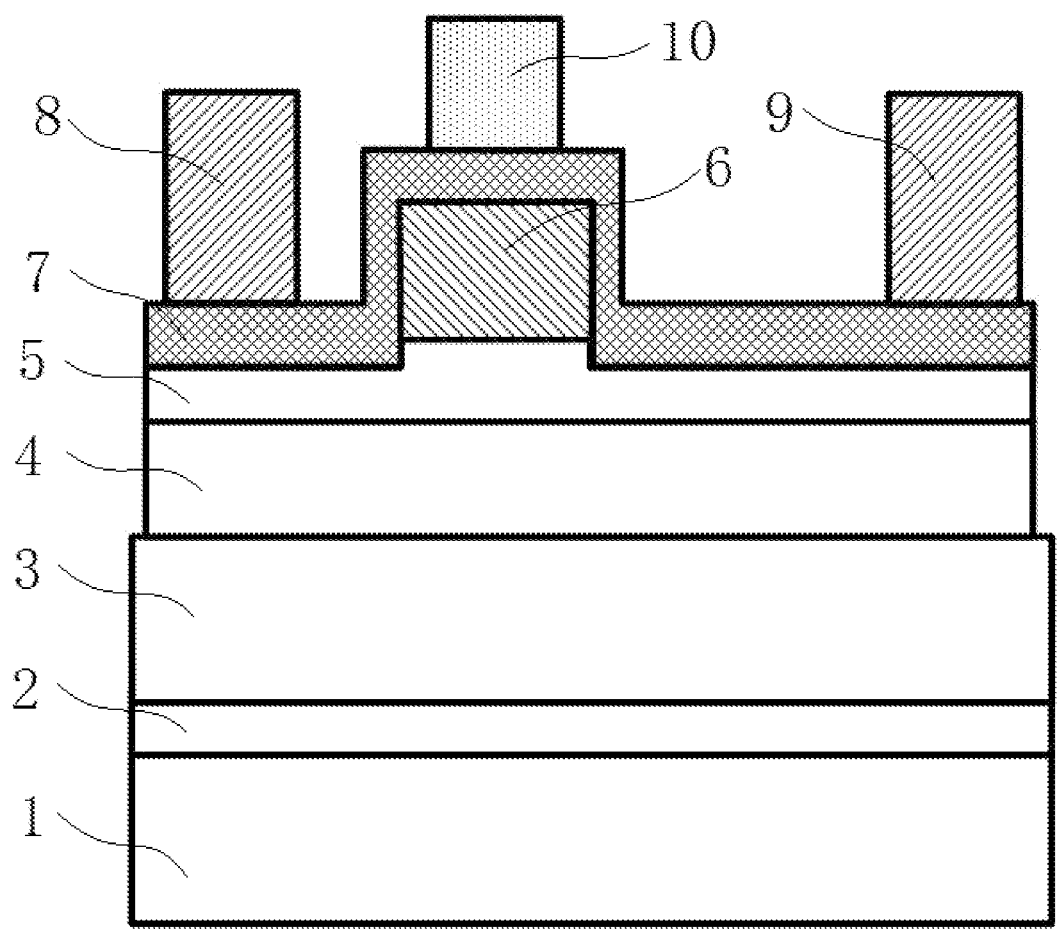
FIG. 12 is a schematic structure diagram of a device of Embodiment 1 of the present invention.

FIG. 12 shows a schematic structure diagram of a device of the present embodiment. A semiconductor enhancement-mode transistor includes a substrate 1, a semiconductor epitaxial layer grown on the substrate 1, a gate electrode 10, a source electrode 8, and a drain electrode 9. The epitaxial layer includes a nitride nucleation layer 2, a nitride stress buffer layer 3, a nitride channel layer 4, a primary epitaxial nitride barrier layer 5, a p-type nitride layer 6 and a secondary epitaxial nitride barrier layer 7 from bottom to top. The p-type nitride layer 6 is only reserved on the primary epitaxial nitride barrier layer 5 in a gate electrode 10 region, realizing the depletion of a two-dimensional electron gas channel under the gate electrode 10. The regrowth is maskless, and the secondary epitaxial nitride barrier layer 7 is regrown on the primary epitaxial barrier layer and the p-type nitride layer 6 of the gate electrode 10 region.

Figure 3:
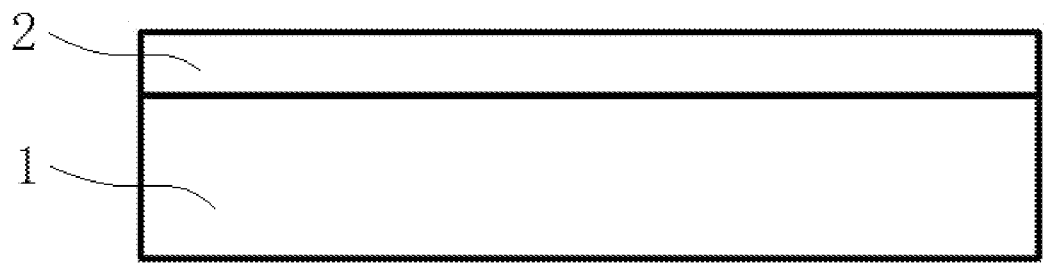

A manufacturing method of the semiconductor enhancement-mode transistor is as shown in FIG. 3 to FIG. 12, and includes the following steps:

S1. a nitride nucleation layer 2 is grown on a substrate 1, as shown in FIG. 3.

Figure 4:
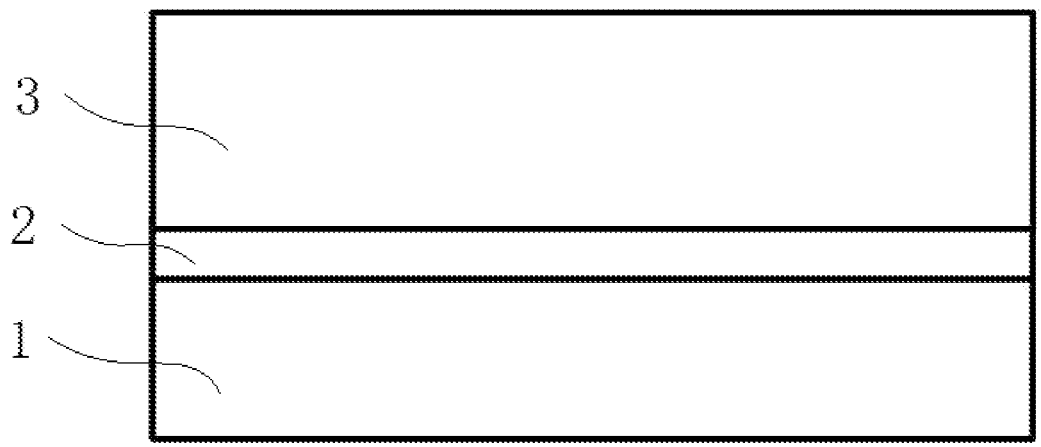

S2. a nitride stress buffer layer 3 is grown on the nitride nucleation layer 2, as shown in FIG. 4.

Figure 5:
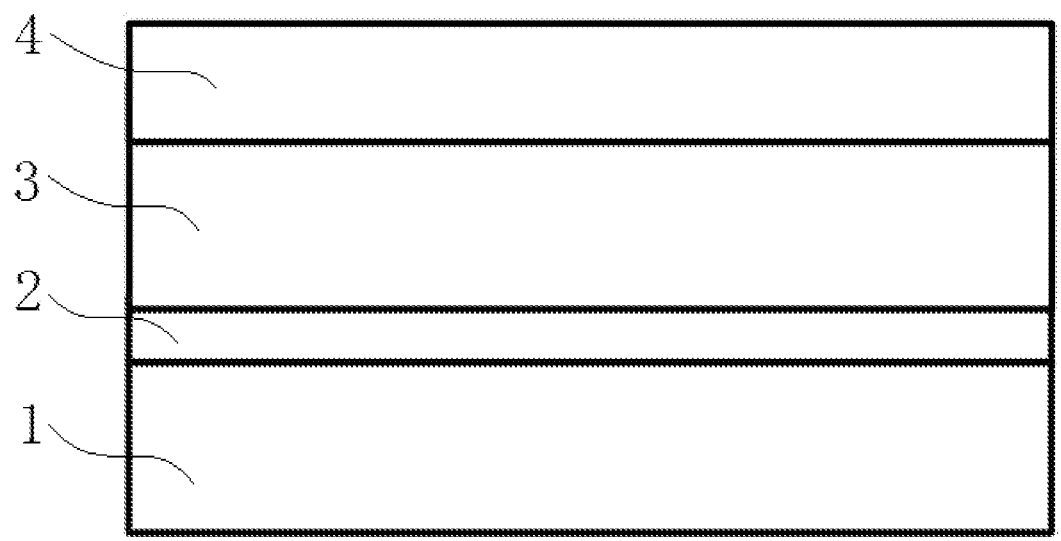

S3. a nitride channel layer 4 is grown on the nitride stress buffer layer 3, as shown in FIG. 5.

Figure 6:
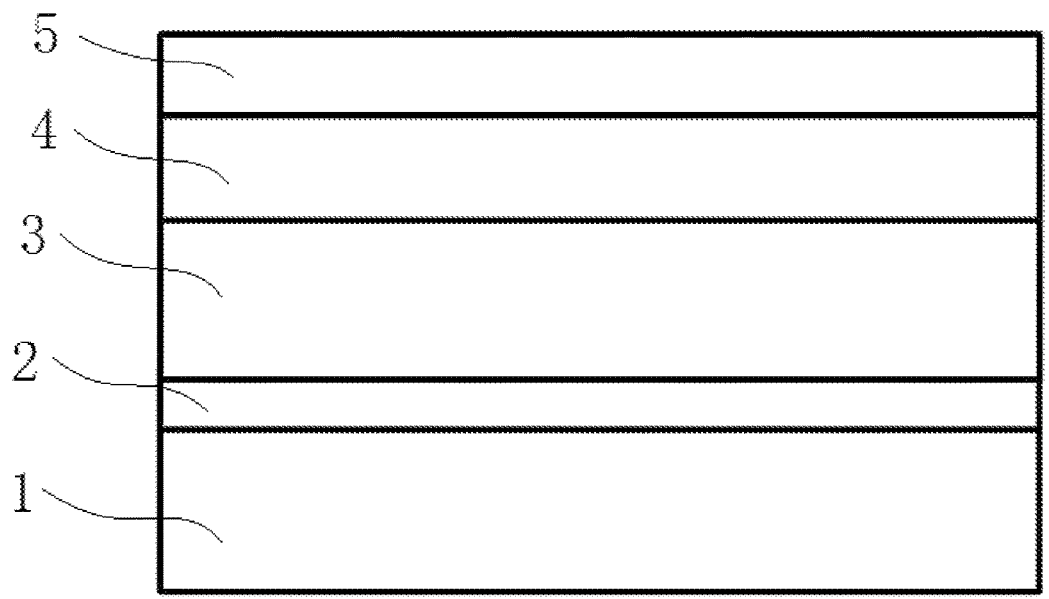

S4. a primary epitaxial nitride barrier layer 5 is grown on the nitride channel layer 4, as shown in FIG. 6.

Figure 7:
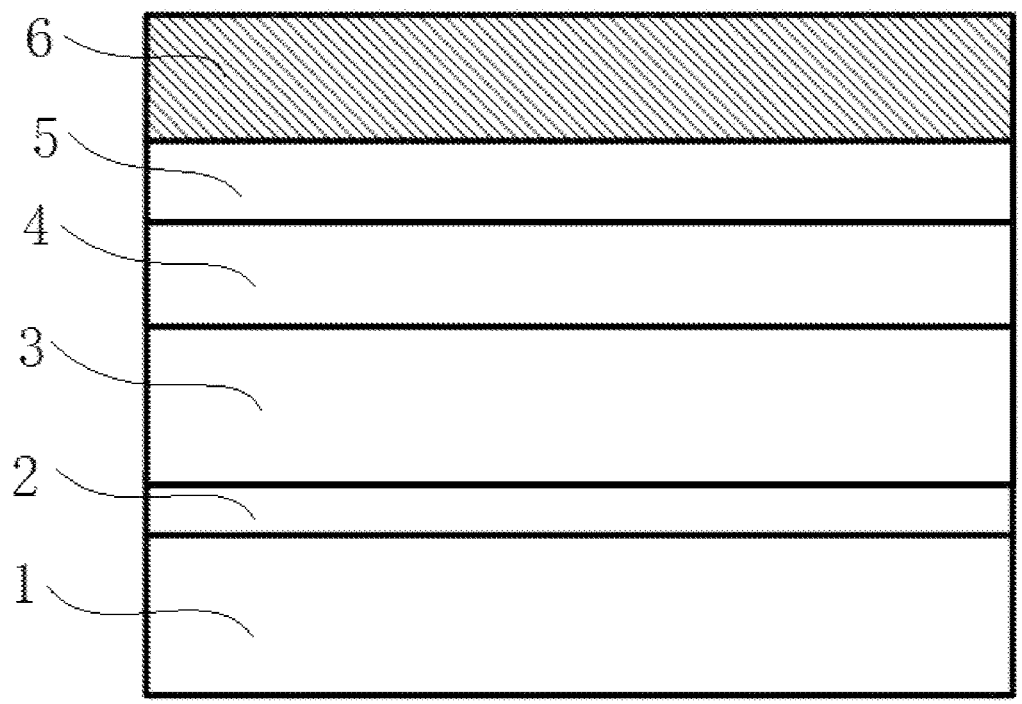

S5. a p-type nitride layer 6 is grown on the primary epitaxial nitride barrier layer 5, as shown in FIG. 7.

Figure 8:
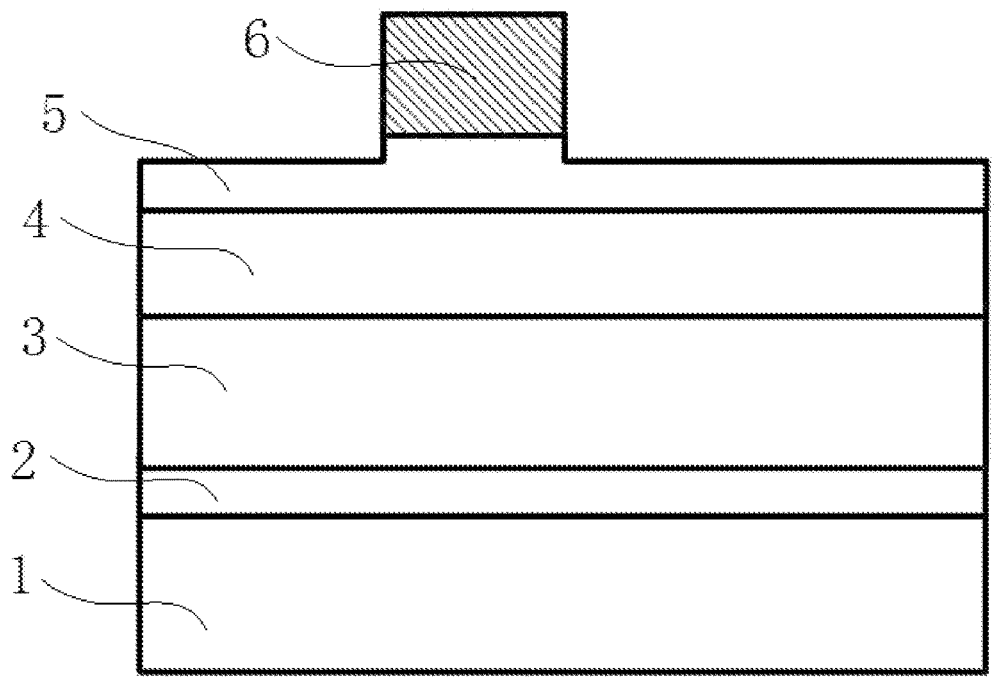

S6. by photolithography patterning and etching methods, the p-type nitride layer 6 beyond the gate electrode 10 region is totally removed, and the primary epitaxial nitride barrier layer 5 beyond the gate electrode 10 region is partially removed, as shown in FIG. 8.

Figure 9:
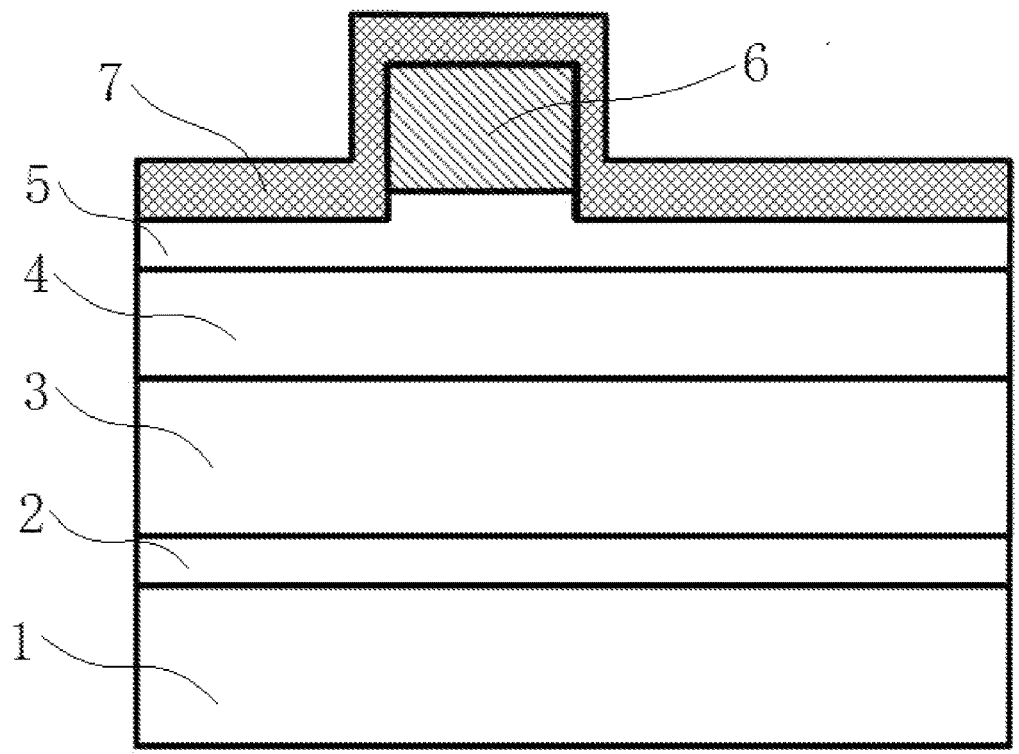

S7. Lattice damage caused by etching is repaired through in-situ high-temperature annealing, and the secondary epitaxial nitride barrier layer 7 further is grown, as shown in FIG. 9.

S8. acceptor doping elements in the p-type nitride layer 6 are activated through high-temperature annealing.

Figure 10:
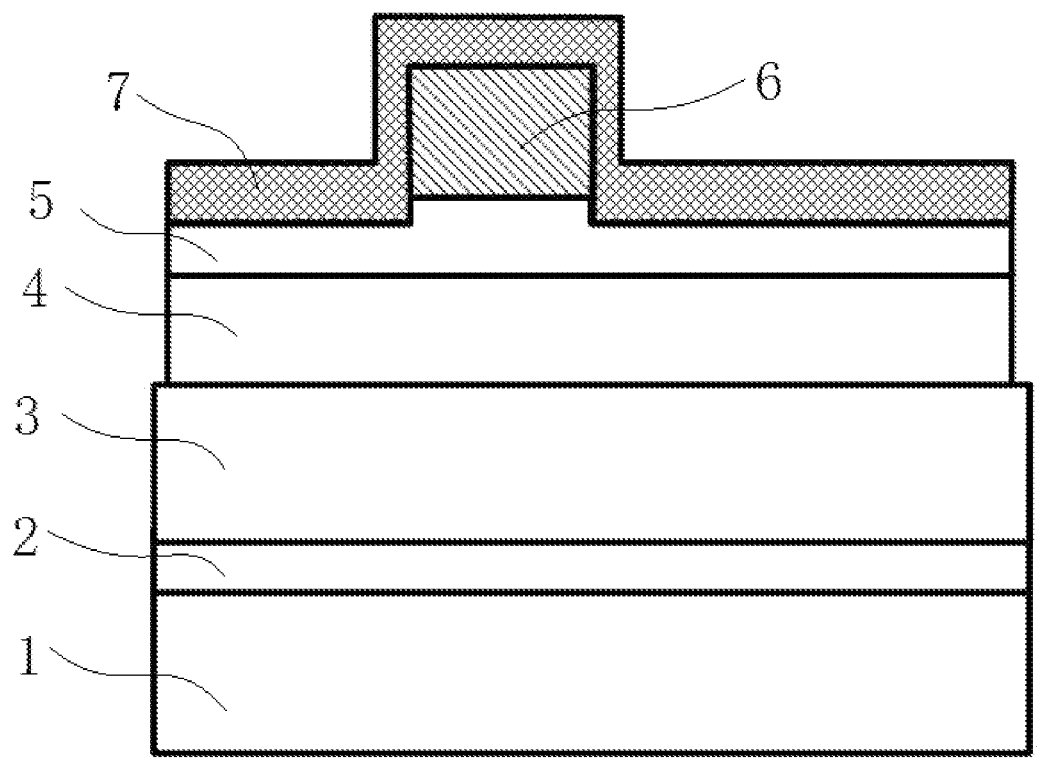

S9. dry etching is performed to complete device isolation, as shown in FIG. 10.

Figure 11:
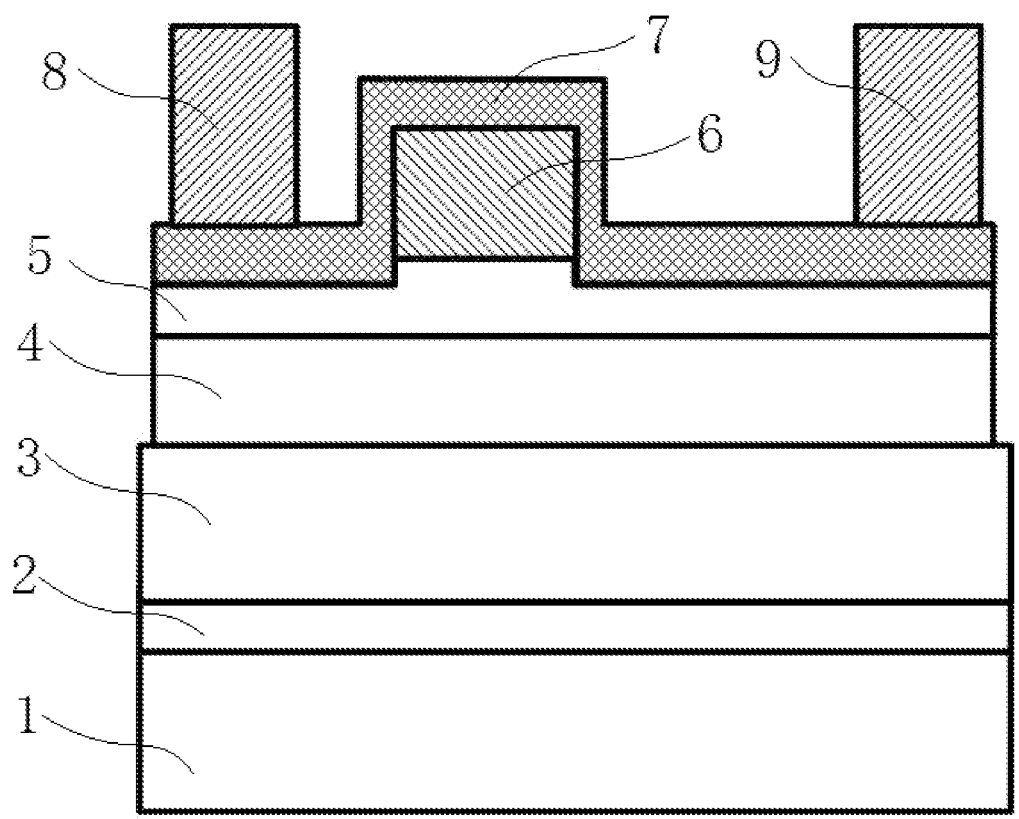

S10. ohmic contact metal of source electrode 8 and drain electrode 9 is formed on contact regions of source electrode 8 and drain electrode 9, as shown in FIG. 11.

S11. metal of gate electrode 10 is formed on the p-type nitride layer 6, as shown in FIG. 12.

So far, the preparation process of the device is completed. FIG. 12 is a schematic structure diagram of the device of Embodiment 1.

Embodiment 2

Figure 13:
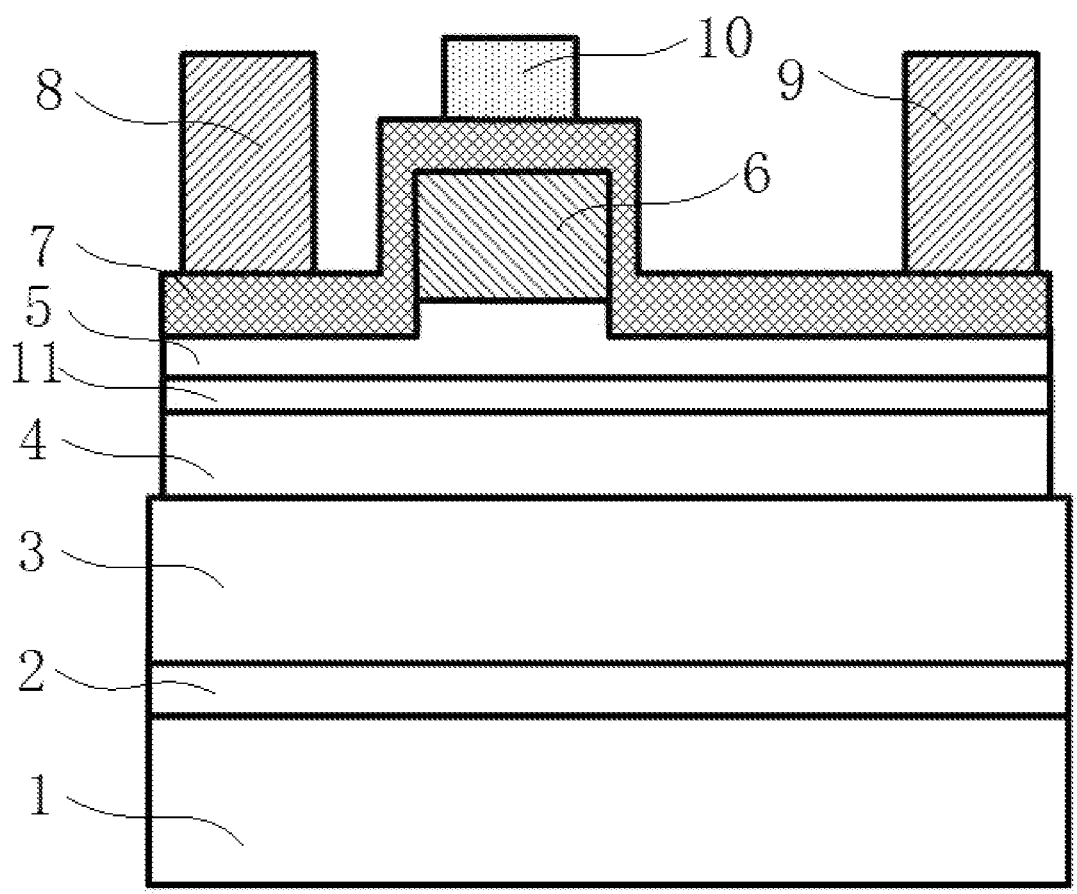
FIG. 13 is a schematic structure diagram of a device of Embodiment 2 of the present invention.

FIG. 13 shows a schematic structure diagram of a device of the present embodiment. The structure of the device of the present embodiment differs from the structure of Embodiment 1 in that in Embodiment 2, an AlN space layer 11 is further clamped between the nitride channel layer 4 and the primary epitaxial nitride barrier layer 5, and the thickness of the AlN space layer 11 is 0.3 nm to 3 nm. The AlN space layer 11 is used to improve two-dimensional electron gas characteristics.

Embodiment 3

Figure 14:
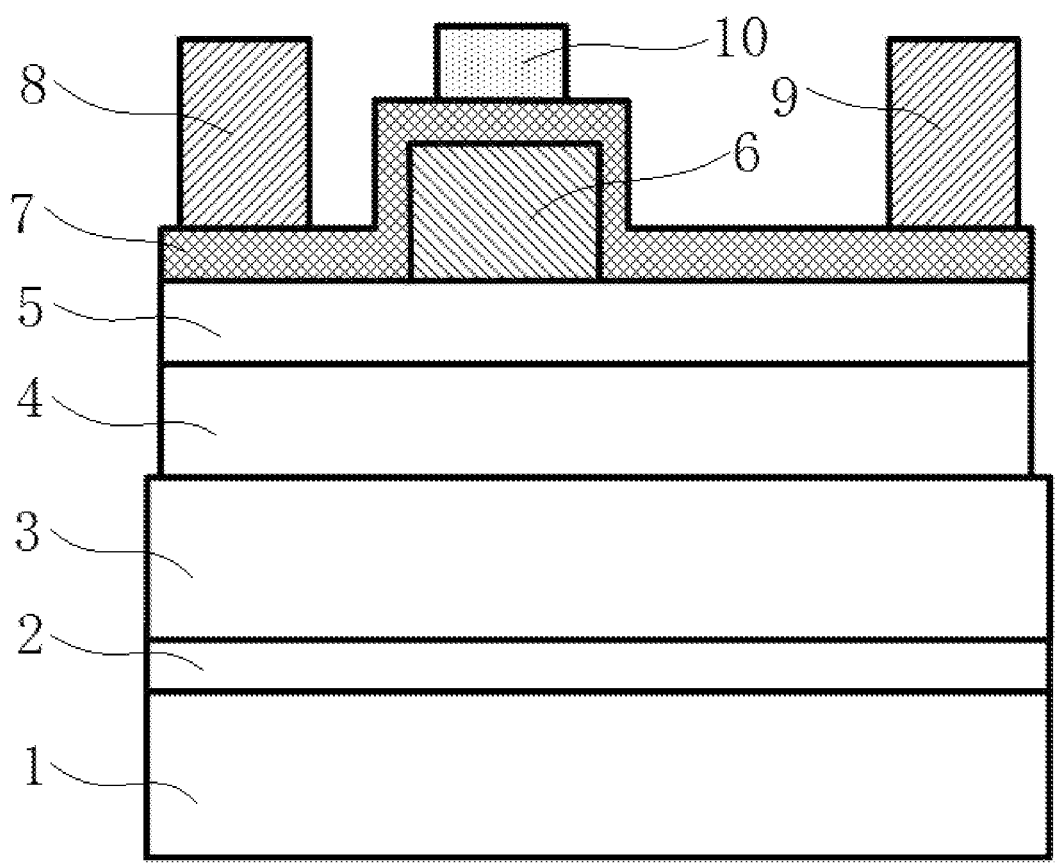
FIG. 14 is a schematic structure diagram of a device of Embodiment 3 of the present invention.

FIG. 14 shows a schematic structure diagram of a device of the present embodiment. The structure of the device of the present embodiment differs from the structure of Embodiment 1 in that in Embodiment 1, the primary epitaxial nitride barrier layer 5 beyond the gate electrode 10 region is partially removed, but the primary epitaxial nitride barrier layer 5 beyond the gate electrode 10 region in Embodiment 3 is completely reserved. Compared with Embodiment 1, Embodiment 3 requires a harsher etching solution, such as more advanced equipments and oxygen-containing or fluorine-containing self-terminating etching conditions.

Embodiment 4

Figure 15:
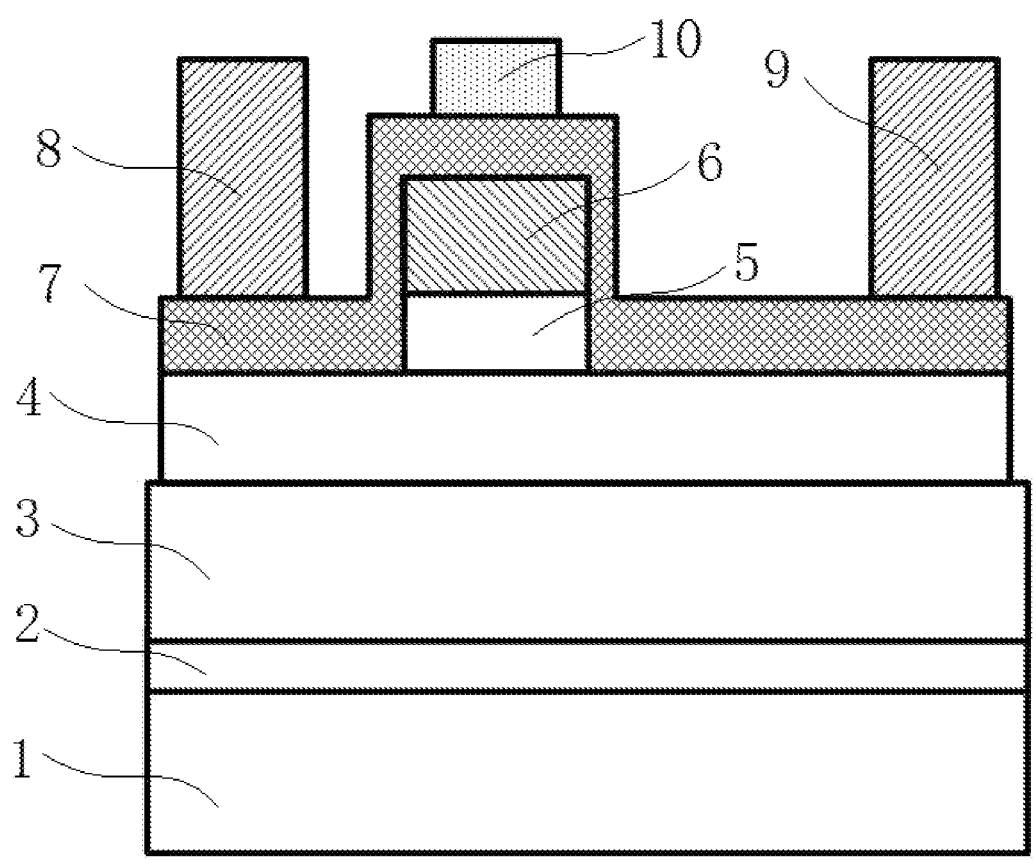
FIG. 15 is a schematic structure diagram of a device of Embodiment 4 of the present invention.

FIG. 15 shows a schematic structure diagram of a device of the present embodiment. The structure of the device of the present embodiment differs from the structure of Embodiment 1 in that in Embodiment 1, the primary epitaxial nitride barrier layer 5 beyond the gate electrode 10 region is partially removed, but the primary epitaxial nitride barrier layer 5 beyond the gate electrode 10 region in Embodiment 4 is totally removed. In Embodiment 4, before the growth of the secondary epitaxial nitride barrier layer 7, the thin-layer AlN space layer 11 can be firstly grown, and the thickness of the thin-layer AlN space layer is 0.3 nm to 3 nm.

Embodiment 5

Figure 16:
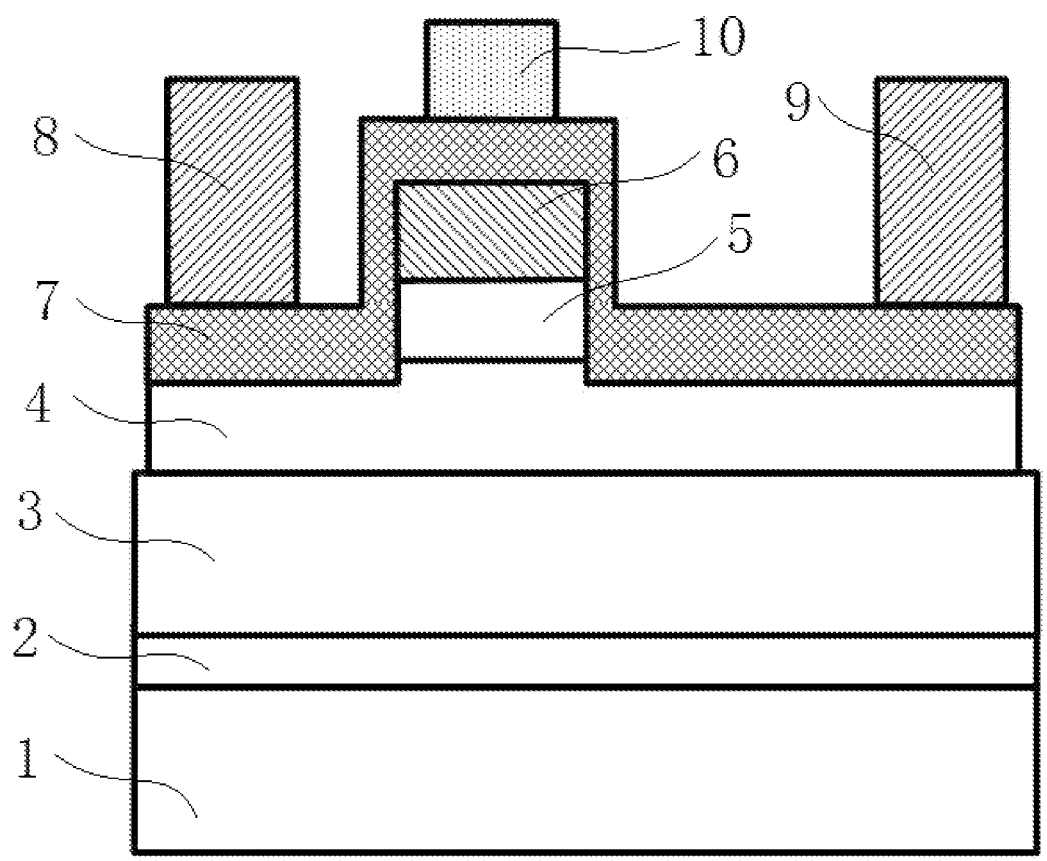
FIG. 16 is a schematic structure diagram of a device of Embodiment 5 of the present invention.

FIG. 16 shows a schematic structure diagram of a device of the present embodiment. The structure of the device of the present embodiment differs from the structure of Embodiment 1 in that in Embodiment 1, the primary epitaxial nitride barrier layer 5 beyond the gate electrode 10 region is partially removed, but the primary epitaxial nitride barrier layer 5 beyond the gate electrode 10 region in Embodiment 5 is totally removed, and the nitride channel layer 4 is further partially removed. In Embodiment 5, before the growth of the secondary epitaxial nitride barrier layer 7, the thin-layer AlN space layer 11 can be firstly grown, and the thickness of the thin-layer AlN space layer is 0.3 nm to 3 nm.

Embodiment 6

Figure 17:
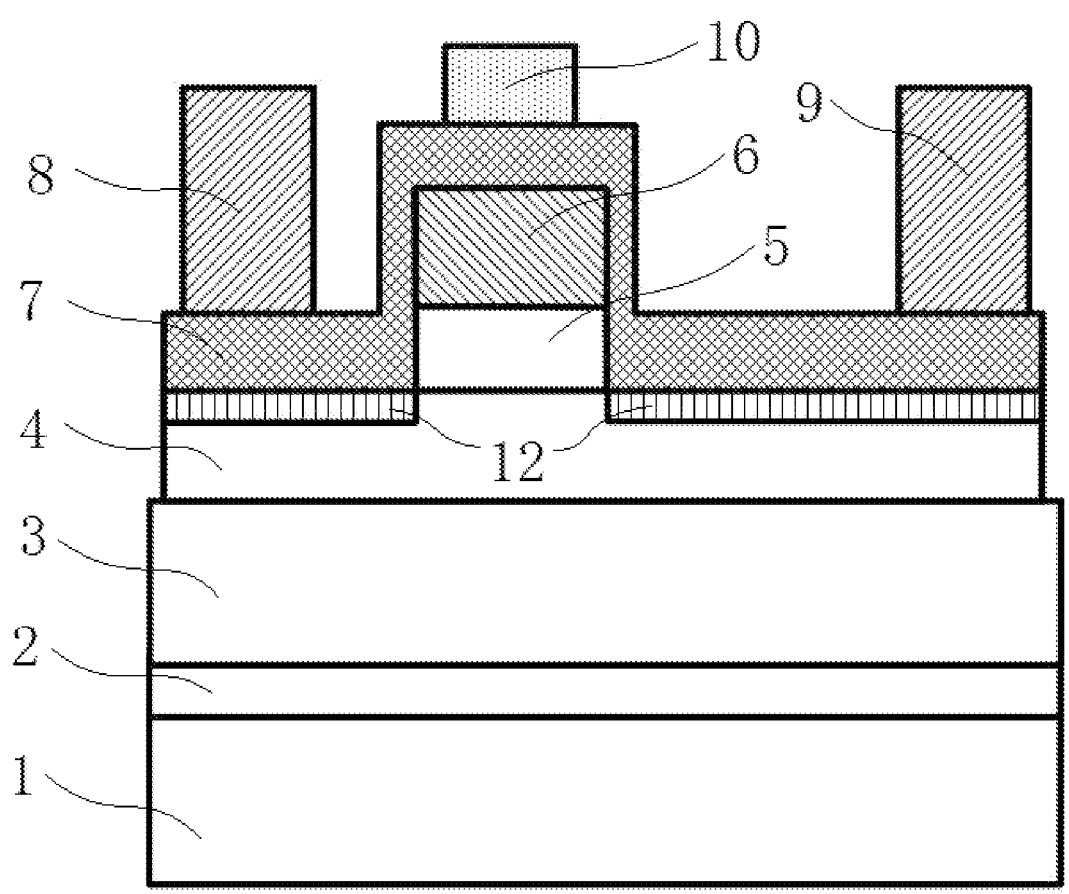
FIG. 17 is a schematic structure diagram of a device of Embodiment 6 of the present invention.

FIG. 17 shows a schematic structure diagram of a device of the present embodiment. The structure of the device of the present embodiment differs from the structure of Embodiment 1 in that in Embodiment 1, the primary epitaxial nitride barrier layer 5 beyond the gate electrode 10 region is partially removed, but the primary epitaxial nitride barrier layer 5 beyond the gate electrode 10 region in Embodiment 6 is totally removed, the nitride channel layer 4 is further partially removed, and a secondary epitaxial nitride channel layer 12 is regrowth. The thickness of the secondary epitaxial nitride channel layer 12 is 1 nm to 10 nm. In Embodiment 6, before the growth of the secondary epitaxial nitride barrier layer 7, the thin-layer AlN space layer 11 can be firstly grown, and the thickness of the thin-layer AlN space layer is 0.3 nm to 3 nm.

Embodiment 7

Figure 18:
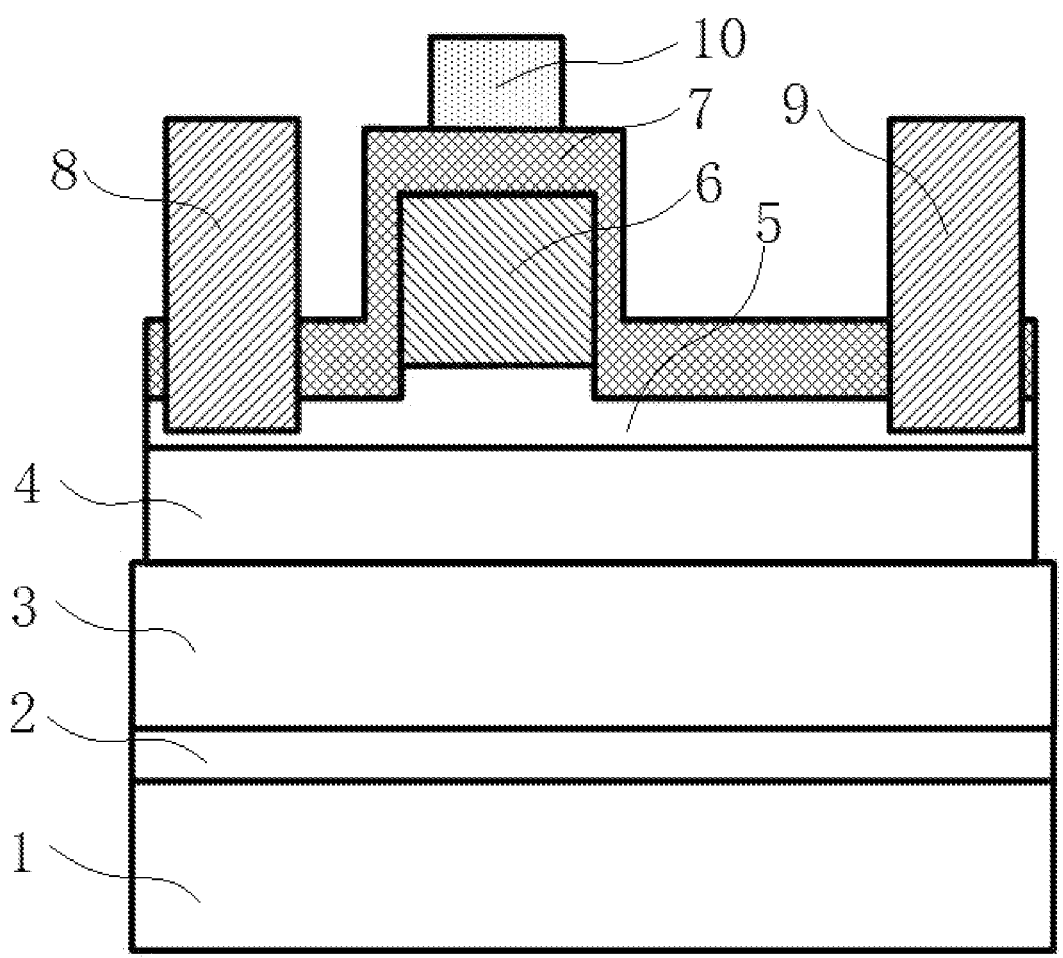
FIG. 18 is a schematic structure diagram of a device of Embodiment 7 of the present invention.

FIG. 18 shows a schematic structure diagram of a device of the present embodiment. The structure of the device of the present embodiment differs from the structure of Embodiment 1 in that in Embodiment 7, the secondary epitaxial nitride barrier layer 7 in ohmic contact regions is etched, the primary epitaxial nitride barrier layer 5 can be further etched to realize better ohmic contact characteristics, and the thickness of the finally reserved barrier layer is 1 nm to 10 nm.

Embodiment 8

Figure 19:
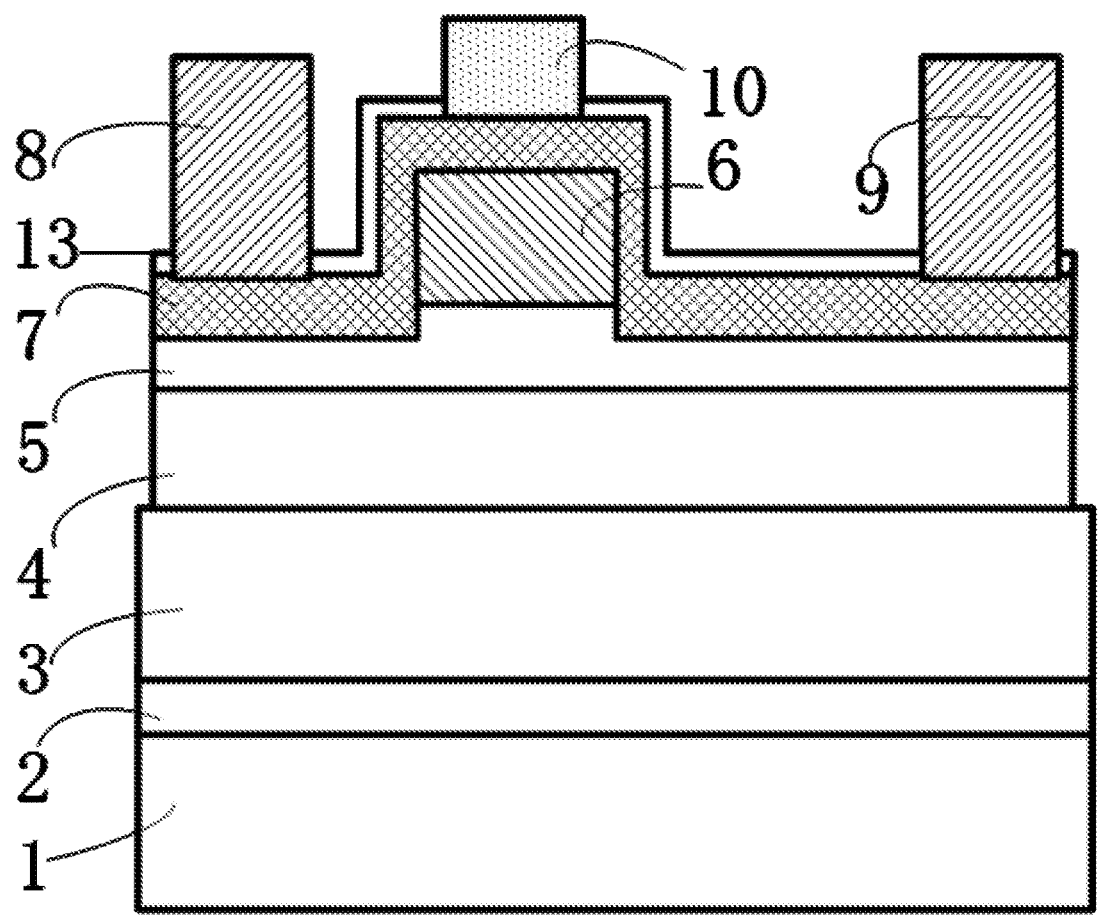
FIG. 19 is a schematic structure diagram of a device of Embodiment 8 of the present invention.

FIG. 19 shows a schematic structure diagram of a device of the present embodiment. The structure of the device of the present embodiment differs from the structure of Embodiment 1 in that in Embodiment 8, a cap layer or passivation layer 13 is in-situ grown on the secondary epitaxial nitride barrier layer 7. The cap layer is GaN, and the thickness of the cap layer is 0 nm to 8 nm. The in-situ passivation layer is $SiN_x$, $SiO_2$, $Al_2O_3$, $AlO_xN_y$, $GaO_x$ or $GaO_xN_y$, and the thickness of in-situ passivation layer is 0 nm to 100 nm.

Embodiment 9

Figure 20:
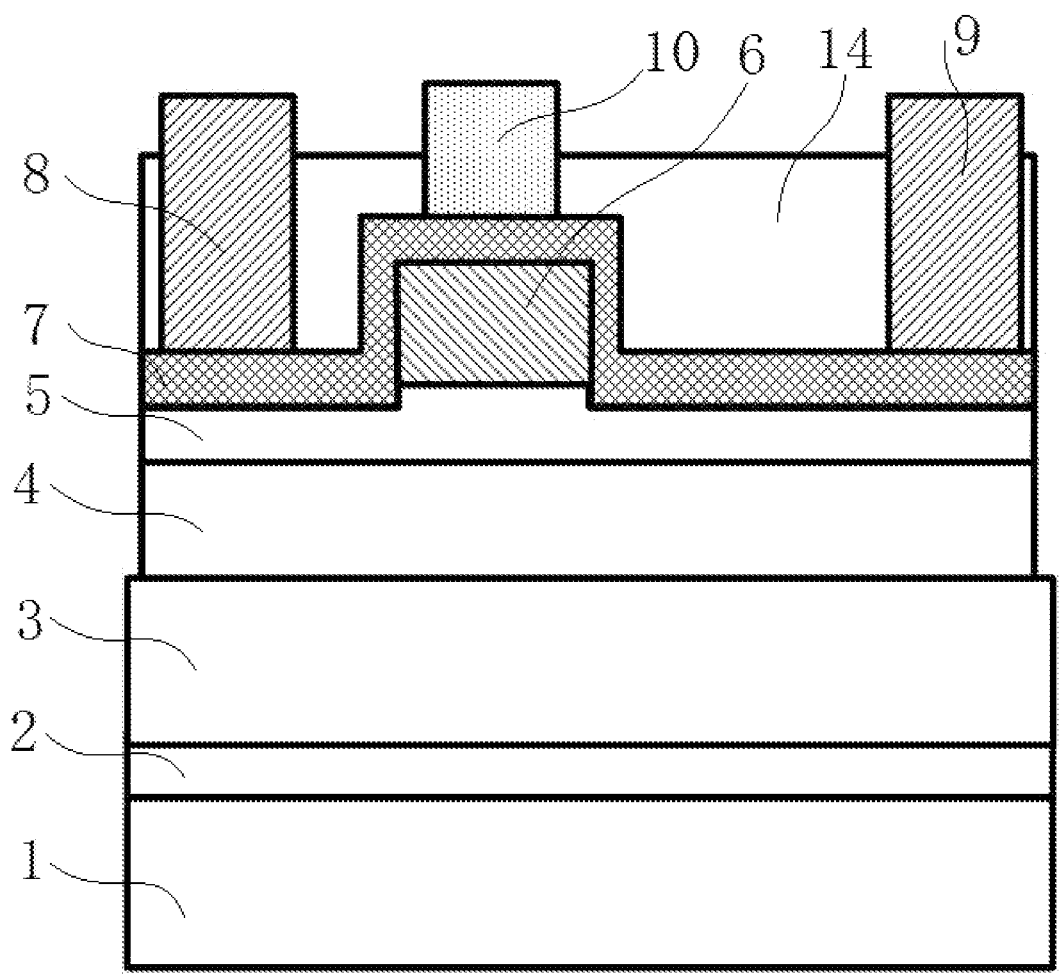
FIG. 20 is a schematic structure diagram of a device of Embodiment 9 of the present invention.

FIG. 20 shows a schematic structure diagram of a device of the present embodiment. The structure of the device of the present embodiment differs from the structure of Embodiment 1 in that in Embodiment 9, a passivation layer 14 is ex-situ grown on the secondary epitaxial nitride barrier layer 7. The passivation layer 14 is dielectric materials such as $SiN_x$, $SiO_2$ and $Al_2O_3$ or stack structure thereof, and growth process of the passivation layer 14 is LPCVD, PECVD, RTCVD, ALD, PEALD and the like.

Embodiment 10

Figure 21:
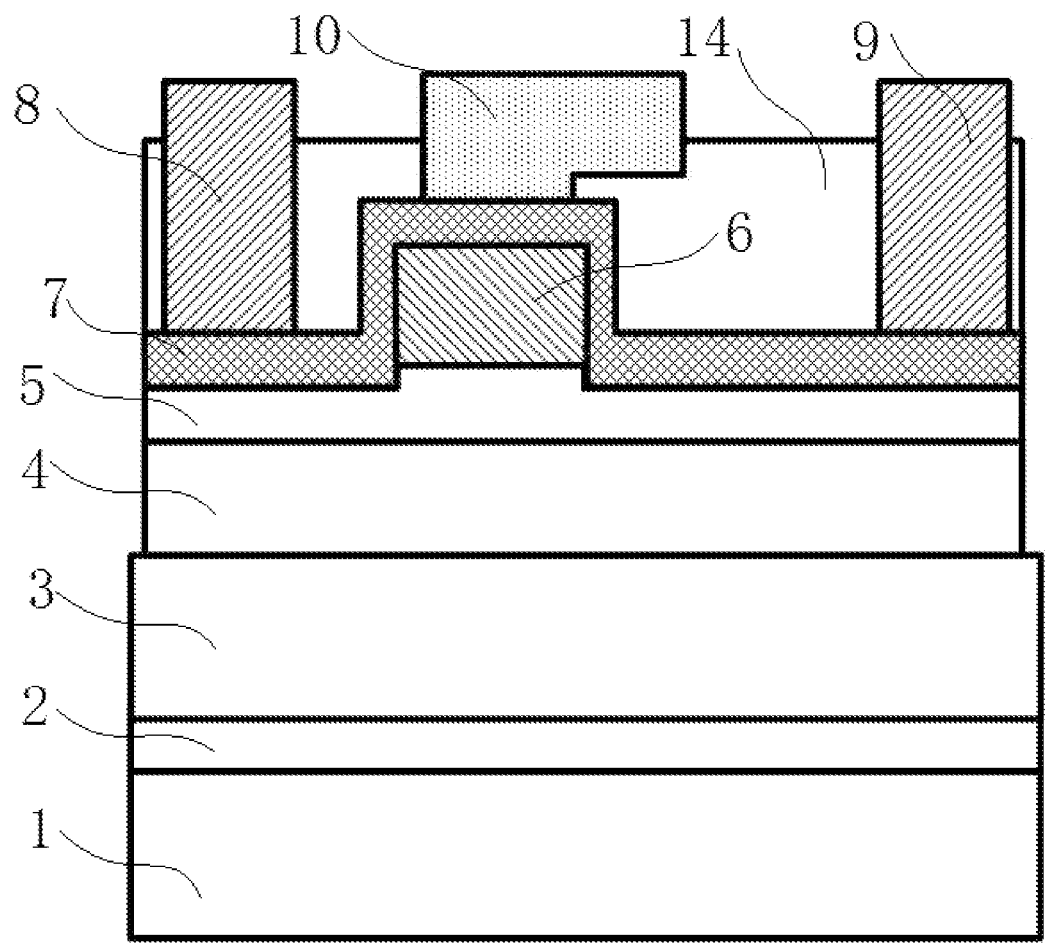
FIG. 21 is a schematic structure diagram of a device of Embodiment 10 of the present invention.

FIG. 21 shows a schematic structure diagram of a device of the present embodiment. The structure of the device of the present embodiment differs from the structures of Embodiment 1 and Embodiment 9 in that in Embodiment 10, gate electrode 10 includes a field plate structure.

Embodiment 11

Figure 22:
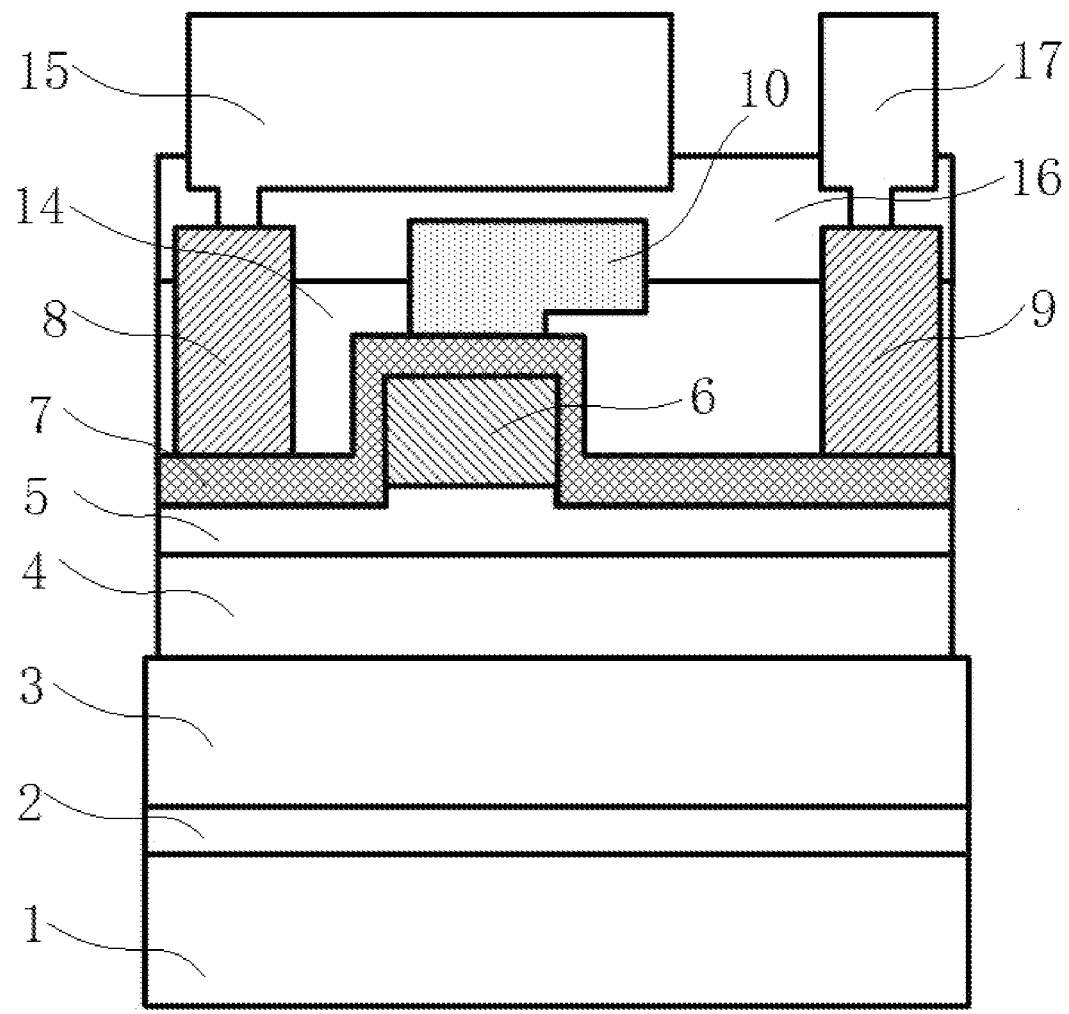
FIG. 22 is a schematic structure diagram of a device of Embodiment 11 of the present invention.

FIG. 22 shows a schematic structure diagram of a device of the present embodiment. The structure of the device of the present embodiment differs from the structures of Embodiment 1 and Embodiment 10 in that in Embodiment 10, source electrode 8 includes a field plate structure.

Embodiment 12

Figure 23:
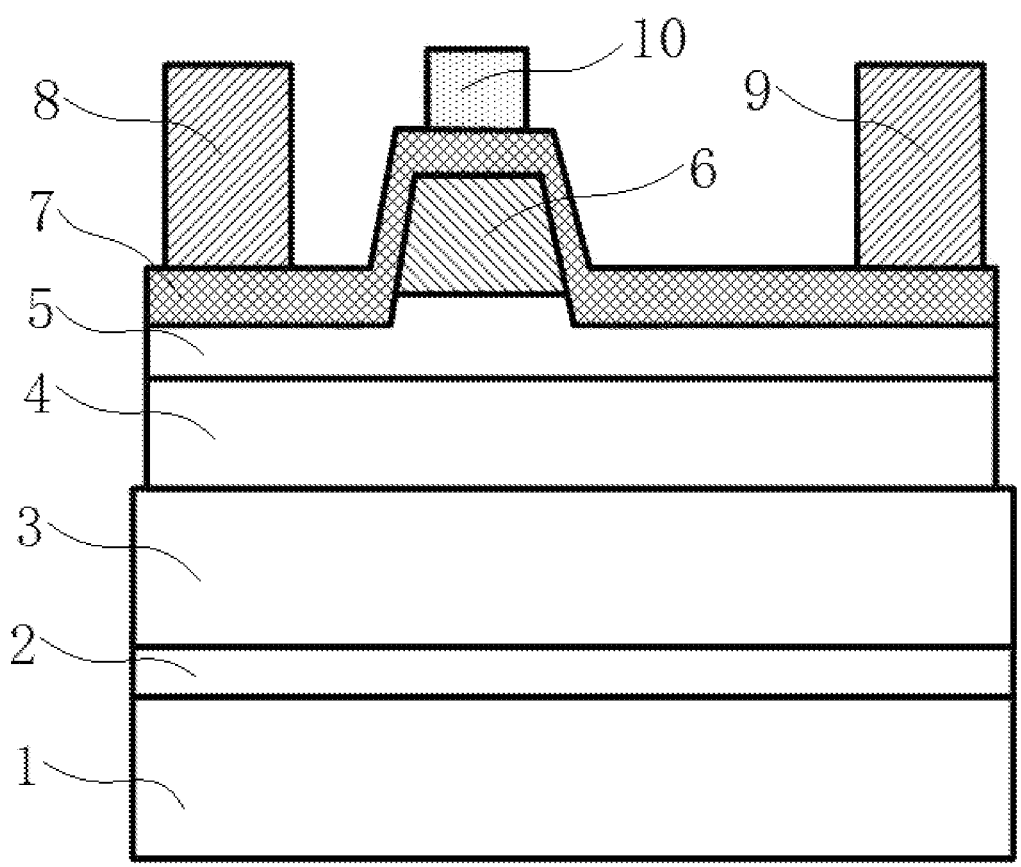
FIG. 23 is a schematic structure diagram of a device of Embodiment 12 of the present invention.

FIG. 23 shows a schematic structure diagram of a device of the present embodiment. The structure of the device of the present embodiment differs from the structure of Embodiment 1 in that in Embodiment 1, the p-type nitride layer 6 has a rectangular shape; and in Embodiment 12, the p-type nitride layer 6 has a trapezoidal shape. Additionally, the p-type nitride apparently may be of a structure in an arc shape, a step shape and the like.

Apparently, the above embodiments of the present invention merely example to describe the present invention clearly and are not intended to limit the implementations of the present invention. The core content of the present invention is regrowth of the barrier layers after the etching of the p-type nitride layer. On one hand, the requirements on the etching process can be reduced, and on the other hand, the enhancement-mode device having high threshold voltage, high conductivity and high stability is further obtained by designing the thicknesses and Al components of the primary epitaxial nitride barrier layer and the secondary epitaxial nitride barrier layer. The present invention has been elucidated with reference to the related art by means of only a few device structures, but it is still feasible in other similar device solutions that have been modified or combined, and these descriptions will not be provided here in detail. It will be apparent to those skilled in the art that various other changes or modifications can be made on the basis of the above descriptions. The technical solutions in the various embodiments, including the sequence of steps, the selection of material types and parameters, the selection of process methods and parameters, and the like, can be varied or combined appropriately, and implementation solutions may can be varied or combined with each other appropriately to form other implementation solutions capable of being understood by those skilled in the art. Herein, examples are unnecessarily provided for all implementations. Any modification, equivalent replacement, improvement and the like made within the spirit and principle of the present invention should be included in a scope of protection of the claims of the present invention.

What is claimed is:

1. An enhancement-mode semiconductor device, comprising a substrate, a semiconductor epitaxial layer grown on the substrate, a gate electrode, a source electrode and a drain electrode, wherein the epitaxial layer comprises a nitride nucleation layer, a nitride stress buffer layer, a nitride channel layer, a primary epitaxial nitride barrier layer, a p-type nitride layer and a secondary epitaxial nitride barrier layer from bottom to top; the p-type nitride layer is only reserved on the primary epitaxial nitride barrier layer in a gate electrode region, realizing the depletion of a two-dimensional electron gas channel under the gate electrode; a regrowth process of the secondary epitaxial nitride barrier layer is maskless; the secondary epitaxial nitride barrier layer is located on the primary epitaxial nitride barrier layer and the p-type nitride layer in the gate electrode region; and gate electrode metal is in direct contact with the secondary epitaxial nitride barrier layer, wherein the primary epitaxial nitride barrier layer is a material of one of AlGaN, AlInN, InGaN, AlInGaN and AlN or a material of a combination of any of AlGaN, AlInN, InGaN, AlInGaN and AlN, an Al component content in the primary epitaxial nitride barrier layer is 1% to 30%, and a thickness of the primary epitaxial nitride barrier layer is 1 nm to 30 nm; the secondary epitaxial nitride barrier layer is one of AlGaN, AlInN, InGaN, AlInGaN and AlN or a combination of any of AlGaN, AlInN, InGaN, AlInGaN and AlN, an Al component content in the secondary epitaxial nitride barrier layer is 1% to 40%, and a thickness of the secondary epitaxial nitride barrier layer is 1 nm to 40 nm; the p-type nitride layer is GaN, AlGaN, AlInN or AlInGaN, and a thickness of the p-type nitride layer is not less than 5 nm, wherein an AlN space layer is further inserted between the primary epitaxial nitride barrier layer and the nitride channel layer, and a thickness of the AlN space layer is 0.3 nm to 3 nm.

2. The enhancement-mode semiconductor device according to claim 1, wherein the substrate is any one of a Si substrate, a sapphire substrate, a silicon carbide substrate, a free-standing GaN substrate or AlN; the nitride stress buffer layer contains any one of AlN, AlGaN, GaN and SiN or a combination of AlN, AlGaN, GaN and SiN; the nitride nucleation layer is an Al-containing nitride layer; and the nitride channel layer is a GaN or AlGaN layer.

3. The enhancement-mode semiconductor device according to claim 2, wherein the p-type nitride layer in the gate electrode region is reserved, and the primary epitaxial nitride barrier layer beyond the p-type nitride layer in the gate electrode region is partially removed, and a thickness of the rest primary epitaxial nitride barrier layer is 1 nm to 30 nm.

4. The enhancement-mode semiconductor device according to claim 3, wherein a cap layer or passivation layer is in-situ grown on the secondary epitaxial nitride barrier layer; the cap layer is GaN, and a thickness of the cap layer is 0.5 nm to 8 nm; and the passivation layer is $SiN_x$, $SiO_2$, $Al_2O_3$, $AlO_xN_y$, $GaO_x$, $GaO_xN_y$, and a thickness of the passivation layer is 1 nm to 100 nm.

5. The enhancement-mode semiconductor device according to claim 4, wherein the source electrode and the drain electrode are in ohmic contact, and the gate electrode is in ohmic contact or Schottky contact.

6. The enhancement-mode semiconductor device according to claim 1, wherein an AlN blocking layer is further inserted between the p-type nitride layer and the primary epitaxial nitride barrier layer, and a thickness of the AlN blocking layer is 0.3 nm to 5 nm.

7. The enhancement-mode semiconductor device according to claim 6, wherein the p-type nitride layer in the gate electrode region is reserved, and the primary epitaxial nitride barrier layer beyond the p-type nitride layer in the gate electrode region is partially removed, and a thickness of the rest primary epitaxial nitride barrier layer is 1 nm to 30 nm.

8. The enhancement-mode semiconductor device according to claim 1, wherein the Al component content in the secondary epitaxial nitride barrier layer is higher than that in the primary epitaxial nitride barrier layer.

9. The enhancement-mode semiconductor device according to claim 8, wherein the p-type nitride layer in the gate electrode region is reserved, and the primary epitaxial nitride barrier layer beyond the p-type nitride layer in the gate electrode region is partially removed, and a thickness of the rest primary epitaxial nitride barrier layer is 1 nm to 30 nm.

10. The enhancement-mode semiconductor device according to claim 1, wherein the p-type nitride layer in the gate electrode region is reserved, and the primary epitaxial nitride barrier layer beyond the p-type nitride layer in the gate electrode region is partially removed, and a thickness of the rest primary epitaxial nitride barrier layer is 1 nm to 30 nm.

11. A preparation method for an enhancement-mode semiconductor device, comprising the following steps:

S1 growing a nitride nucleation layer on a substrate;

S2 growing a nitride stress buffer layer on the nitride nucleation layer;

S3 growing a nitride channel layer on the nitride stress buffer layer;

S4 growing a primary epitaxial nitride barrier layer on the nitride channel layer;

S5 growing a p-type nitride layer on the primary epitaxial nitride barrier layer;

S6 forming a p-type nitride layer which is only reserved on the primary epitaxial nitride barrier layer in a gate electrode region, by photolithography patterning and etching methods;

S7 growing a secondary epitaxial nitride barrier layer; wherein the secondary epitaxial nitride barrier layer is located on the primary epitaxial barrier layer and the p-type nitride layer, and a growth process of the secondary epitaxial nitride barrier layer is maskless;

S8 activating acceptor doping elements in the p-type nitride layer through high-temperature annealing;

S9 performing dry etching to complete device isolation, and simultaneously etching out contact regions of source electrode and drain electrode;

S10 forming source electrode and drain electrode ohmic contact metal on source electrode and drain electrode regions; and S11 forming gate electrode metal on the p-type nitride layer and secondary epitaxial nitride barrier layer in a gate electrode region; wherein gate electrode metal is in direct contact with the secondary epitaxial nitride barrier layer, wherein the primary epitaxial nitride barrier layer is a material of one of AlGaN, AlInN, InGaN, AlInGaN and AlN or a material of a combination of any of AlGaN, AlInN, InGaN, AlInGaN and AlN, an Al component content in the primary epitaxial nitride barrier layer is 1% to 30%, and a thickness of the primary epitaxial nitride barrier layer is 1 nm to 30 nm; the secondary epitaxial nitride barrier layer is one of AlGaN, AlInN, InGaN, AlInGaN and AlN or a combination of any of AlGaN, AlInN, InGaN, AlInGaN and AlN, an Al component content in the secondary epitaxial nitride barrier layer is 1% to 40%, and a thickness of the secondary epitaxial nitride barrier layer is 1 nm to 40 nm; the p-type nitride layer is GaN, AlGaN, AlInN or AlInGaN, and a thickness of the p-type nitride layer is not less than 5 nm, wherein an AlN space layer is further inserted between the primary epitaxial nitride barrier layer and the nitride channel layer, and a thickness of the AlN space layer is 0.3 nm to 3 nm.

* * * * *